United States Patent
Maruyama

(10) Patent No.: US 8,221,549 B2
(45) Date of Patent: Jul. 17, 2012

(54) SILICON CARBIDE SINGLE CRYSTAL WAFER AND PRODUCING METHOD THEREOF

(75) Inventor: Takayuki Maruyama, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 1253 days.

(21) Appl. No.: 11/912,207

(22) PCT Filed: Apr. 19, 2006

(86) PCT No.: PCT/JP2006/308229
§ 371 (c)(1),
(2), (4) Date: Dec. 10, 2007

(87) PCT Pub. No.: WO2006/115148
PCT Pub. Date: Nov. 2, 2006

(65) Prior Publication Data
US 2009/0302326 A1 Dec. 10, 2009

(30) Foreign Application Priority Data

Apr. 22, 2005 (JP) .............................. P2005-125548
Mar. 15, 2006 (JP) .............................. P2006-071468

(51) Int. Cl.
*C30B 25/20* (2006.01)
(52) U.S. Cl. ............. 117/104; 117/86; 117/95; 117/101
(58) Field of Classification Search .................... 117/86, 117/94, 95, 101, 104
See application file for complete search history.

(56) References Cited

U.S. PATENT DOCUMENTS

| | | | |
|---|---|---|---|
| 4,912,064 A | 3/1990 | Kong et al. | |
| 4,946,547 A * | 8/1990 | Palmour et al. | ............... 117/97 |
| 5,248,385 A | 9/1993 | Powell | |
| 5,915,194 A | 6/1999 | Powell et al. | |
| 6,641,938 B2 * | 11/2003 | Landini et al. | ............... 428/698 |
| 2005/0077591 A1 | 4/2005 | Fukuda et al. | |

FOREIGN PATENT DOCUMENTS

| | | |
|---|---|---|
| EP | 1298234 A2 | 4/2003 |
| EP | 1619276 A2 | 1/2006 |
| EP | 1785512 A1 | 5/2007 |
| JP | 2003-95798 A | 4/2003 |
| JP | 2003-282451 A | 10/2003 |
| JP | 2003-342099 A | 12/2003 |

OTHER PUBLICATIONS

K. Kojima et al., "Homoepitaxial growth of 4H-SiC on on-axis (0 0 0 1) C-face substrates by chemical vapor deposition", Journal of Crystal Growth, vol. 269, 2004, pp. 367-376.

* cited by examiner

*Primary Examiner* — Bob M Kunemund
(74) *Attorney, Agent, or Firm* — Sughrue Mion, PLLC

(57) ABSTRACT

A silicon carbide single crystal wafer wherein a substrate is cut out at an OFF angle from a (0001) c plane of an α-type silicon carbide single crystal of less than 2° and in an OFF direction in which a deviation from a (11-20) direction is less than 10°, the number of substantially triangular lamination defects exposed from a surface of a wafer which is epitaxial grown on the substrate is less than 4/cm² over the entire surface of the wafer. The invention provides a producing method of a silicon carbide single crystal wafer capable of enhancing the utility ratio of the bulk silicon carbide single crystal, the element characteristics and the cleavage, as well as a silicon carbide single crystal wafer obtained by such a producing method.

11 Claims, 6 Drawing Sheets

SILICON CARBIDE SINGLE CRYSTAL WAFER AND PRODUCING METHOD THEREOF

FIELD OF THE INVENTION

The present invention relates to a silicon carbide single crystal wafer which is suitable for an electron device and an optical device, and a method for efficiently producing the silicon carbide single crystal wafer.

DESCRIPTION OF THE RELATED ART

Silicon carbide has a great band gap and excellent breakdown strength, heat resistance and radiation resistance as compared with silicon and thus, the silicon carbide receives attention as a material for an electron device such as a small and high output semiconductor. Further, since the silicon carbide has excellent consistency with another compound semiconductor having excellent optical characteristics, the silicon carbide receives attention as a material for an optical device. Silicon carbide single crystal among silicon carbide crystals has a merit of excellent uniformity in characteristics in a wafer when it is applied to a device such as a wafer as compared with silicon carbide polycrystal.

When a light-emitting device or an electron device is to be produced using a silicon carbide single crystal wafer, it is usually necessary to epitaxially grow a thin film on the wafer. In order to epitaxially grow an α-type silicon carbide on a (0001) c plane of an α-type silicon carbide single crystal wafer, CVD growth is carried out at a high temperature of 1700 to 1800° C. or higher. This is because that if the growth is carried out at a temperature lower than 1700° C., a triangular pit defect is generated, and a flatness of a growing surface is largely deteriorated. If the film is grown at 1700 to 1800° C. or higher, however, a member such as a susceptor which sustains a wafer is worn badly, and there is a tendency that electric characteristics of an epitaxially grown film are deteriorated due to the impurities generated from the worn material.

If a wafer having a so-called OFF angle which is inclined with respect to the (0001) c plane of the wafer by several degrees is used, epitaxial growth having no defect can be carried out even at 1500 to 1600° C. However, if the OFF angle is large, a utility ratio of a bulk single crystal is lowered. Especially as an opening diameter of a wafer is increased, the utility ratio of the bulk single crystal is largely lowered. Further, If the OFF angle is large, a crystal defect of a substrate, especially propagation of a base bottom surface dislocation to an epitaxial growing layer is increased, the density of the base bottom surface dislocation in a growing crystal is increased and thus, element characteristics is deteriorated. Further, if the OFF angle is large, it becomes difficult to separate a produced element by a cleavage. This is a serious problem in an optical device which utilizes a cleavage plane itself such as a laser diode.

Several techniques are proposed to solve the above problems, they are susceptible to improvement in terms of enhancement of the utility ratio of the bulk silicon carbide single crystal and enhancement of element characteristics (see patent document 1 for example).

Patent Document 1: U.S. Pat. No. 4,912,064

SUMMARY OF THE INVENTION

Hence, a producing method of a silicon carbide single crystal wafer capable of enhancing the utility ratio of the bulk silicon carbide single crystal, the element characteristics and the cleavage, as well as a silicon carbide single crystal wafer obtained by such a producing method are desired.

The present invention relates to the following descriptions:

(1) A silicon carbide single crystal wafer wherein a substrate is cut out at an OFF angle from a (0001) c plane of an α-type silicon carbide single crystal of less than 2° and in an OFF direction in which a deviation from a (11-20) direction is less than 10°, the number of substantially triangular lamination defects exposed from a surface of a wafer which is epitaxial grown on the substrate is less than 4/cm² over the entire surface of the wafer.

(2) The silicon carbide single crystal wafer according to (1) above, wherein the number of substantially triangular lamination defects which are found after molten alkali etching processing is less than 4/cm² over the entire surface of the wafer.

(3) The silicon carbide single crystal wafer according to (1) or (2) above, wherein surface roughness of the entire surface of the wafer is 2 nm or less and the surface is flat.

(4) The silicon carbide single crystal wafer according to any one of (1) to (3) above, wherein the OFF angle is in a range of 0.1 to 1°.

(5) The silicon carbide single crystal wafer according to any one of (1) to (4) above, wherein the OFF direction has a deviation from a (11-20) direction in a range of 0 to 5°.

(6) A producing method of a silicon carbide single crystal wafer including:

cutting out a wafer in an OFF direction in which at an OFF angle from a (0001) c plane of an α-type silicon carbide single crystal is less than 2° and a deviation from a (11-20) direction is less than 10°, disposing the wafer in a reaction container, supplying silicon source gas and carbon source gas into the reaction container, and reacting the silicon source gas and the carbon source gas with each other and for epitaxially growing an α-type (hexagonal) silicon carbide single crystal on the wafer.

(7) The producing method of the silicon carbide single crystal wafer according to (6) above, wherein the OFF angle is in a range of 0.1 to 1°.

(8) The producing method of the silicon carbide single crystal wafer according to (6) or (7) above, wherein the OFF direction has a deviation from a (11-20) direction in a range of 0 to 5°.

(9) The producing method of the silicon carbide single crystal wafer according to any one of (6) to (8) above, wherein a surface processing is carried out before the epitaxial growth so that the surface of the wafer cut out from the silicon carbide single crystal does not include working damage.

(10) The producing method of the silicon carbide single crystal wafer according to any one of (6) to (9) above, wherein a supply ratio (C/Si) of the carbon source gas (C) and the silicon source gas (Si) is 1.5 or less.

(11) The producing method of the silicon carbide single crystal wafer according to any one of (6) to (10) above, wherein the carbon source gas and the silicon source gas react with each other at 1550 to 1700° C.

DETAILED DESCRIPTION OF THE INVENTION

The present invention will be explained below on the basis of embodiments. The invention is not limited to the embodiments of course.

To solve the above problems, the present inventors completely removed a machining damage layer remaining on a surface of a substrate, reduced a C/Si ratio at the time of the growth from 1.8-2.2 in the normal case to 1.5 or less, used a substrate having the OFF angle of 0.4° or more on its substantially entire surface, and could grow an epitaxial film of an extremely flat surface without a defect even on a just-substrate having a small OFF angle (0.4 to 1°). The inventors found that if an OFF direction of the substrate used for the growth was set from (11-20) to 2.5° or less, it was possible to grow an epitaxial film of an extremely flat surface generating no line bump even when the OFF angle was less than 0.4° (0.1 to 0.4°).

Figure 3:
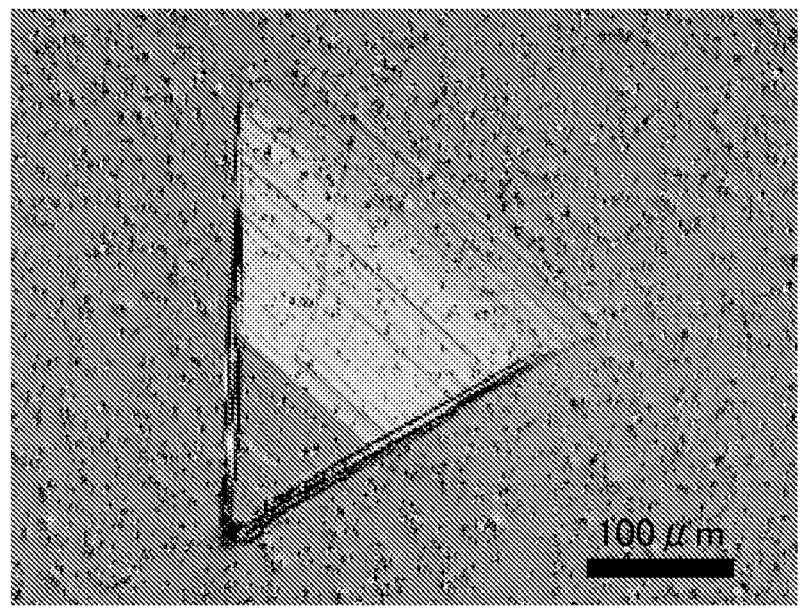
FIG. 3 is a diagram showing a differential interference optical microscope image of a surface of a silicon carbide single crystal wafer after etching processing according to the Comparative Example 1.

However, although the epitaxial growth of the extremely flat surface could be obtained, the inventors found that if the surface was etched with molten alkali, a substantially triangular lamination defect as shown in FIG. 3 which was different from the conventional triangular pit or bump was generated at a depth of several μm from the surface. Here, the term "lamination defect" means a region where an etching speed with respect to the molten alkali is different because a lamination structure in an axial direction of (0001) c is different from a crystal structure of other portions of the wafer. Existence and shape of such region can easily be confirmed by a differential interference (Nomarski) optical microscope after molten alkali etching processing. Substantially triangular regions including a shape in which a portion or all of the sides thereof are arc or corrugated, or a triangular shape connected to a polygonal shape are defined as "substantially triangular lamination defect found after molten alkali etching processing" in the specification and claims.

It is known that the lamination defect of silicon carbide increases an opposite direction leak current of Schottky diode and affects device characteristics (see Basic and application of Sic element, by Ohmsha Ltd, 2003, p. 203).

The substantially triangular lamination defect found here is generated on a plane which is in parallel to the (0001) c plane, an area thereof occupying in the wafer surface is increased as the OFF angle becomes smaller. Therefore, to provide a high quality wafer having small OFF angle, it is extremely important to prevent such lamination defects from being generated and incorporated.

Hence, the present inventors further researched and found that if the OFF direction of a substrate was changed from (11-20) to less than 10°, even when the OFF angle was smaller than 2° (0.1 to 2°), epitaxial growth without including substantially triangular lamination defect could be carried out and the inventors achieved the present invention.

Figure 6:
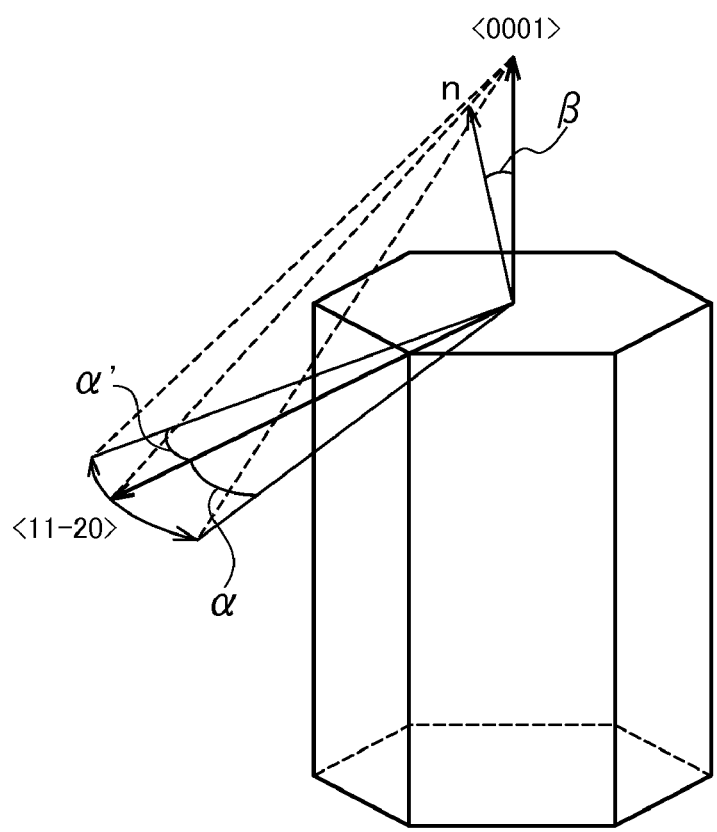
FIG. 6 is a schematic diagram showing an OFF angle and an OFF orientation of a hexagonal silicon carbide single crystal.

In the specification and claims, the term "OFF direction" means a direction from which a normal of the wafer surface shown n in FIG. 6 is inclined from the (0001) c axial direction, and is shown with a direction of vector in which n is projected on the (0001) c plane. In FIG. 6, the OFF direction of n matches with the (11-20) direction. FIG. 6 also shows a case the OFF direction is deviated from the (11-20) direction by α or α'°. The "OFF angle" means an angle through which n inclines from the (0001) c axial direction shown with β in FIG. 6. That is, the OFF angle is an angle from the (0001) c plane.

An embodiment of a producing method of a silicon carbide single crystal wafer will be explained:

(A) First, a bulk a type (hexagonal) silicon carbide single crystal is prepared.

(B) From the prepared silicon carbide single crystal, a wafer is cut in an OFF direction in which a deviation from the (11-20) direction is less than 10° and an OFF angle from the (0001) c plane is less than 2°. This is because that if the deviation from the (11-20) direction exceeds 10°, a substantially triangular lamination defect is generated. This is also because that if the OFF angle exceeds 2°, deterioration of the utility ratio of the bulk crystal and the element characteristics can not be negligible. It is preferable that the OFF angle is in a range of 0 to 1° and more preferably, in a range of 0.1 to 1°. It is preferable that the deviation of the OFF direction from the (11-20) direction is in a range of 0 to 50, and more preferably in a range of 0 to 2.5°. An epitaxial growth defect may be caused due to a surface defect of a substrate. To prevent epitaxial growth defect from being generated, a surface of the cut wafer is processed and a machining damage on the wafer surface is removed. Examples of the surface processing are chemical mechanical polishing (CMP) and hydrogen etching.

(C) Next, the wafers are disposed in the chemical-vapor deposition device. Examples of the chemical-vapor deposition device are vertical type or horizontal type hot wall CVD.

(D) An interior in the reaction container is heated to a reaction temperature and then, silicon source gas and carbon source gas are supplied. Examples of the silicon source gas are monosilane, monochlorosilane, dichlorosilane and trichlorosilane. Among them, monosilane gas is preferable because its reaction property is high and corrosive by-product is not generated. Examples of the carbon source gas are acetylene, ethylene, ethane and propane. Among them, propane gas is preferable because it is efficient as a carbon source. It is preferable that hydrogen ($H_2$) gas is used as carrier gas. A supply ratio (C/Si) of carbon (C) in the carbon source gas and silicon (Si) in the silicon source gas is 1.5 or less, preferably in a range of 0.5 to 1.4. If the C/Si is less than 0.5, silicon is deposited in the vapor phase and excellent epitaxial growth becomes difficult, and if C/Si exceeds 1.4, a slight crystal defect and a visible micro triangular pit defect can easily be generated on the substrate surface. It is of course possible to grow a film with the above-described C/Si in the initial growing stage and then, to continuously grow a different layer under a condition which is different from the C/Si. A substrate surface is etched during the course of temperature rising or lowering, or appropriate gas is introduced to suppress the etching. It is also possible to mix gas including an appropriate amount of impurities to obtain intended electric characteristics during growing.

(E) Silicon source gas and carbon source gas react with each other to epitaxially grow silicon carbide single crystal on wafers. For example, it is preferable to flow hydrogen gas while rotating the wafers and increase the temperature while keeping the pressure at 0 to 200 mbar. To suppress etching of the substrate, an appropriate amount of propane gas is introduced when the temperature exceeds 1300 to 1400° C. The temperature is increased to 1550 to 1700° C. and is maintained, appropriate amounts of silane gas and propane gas are introduced such that the above-described C/Si is obtained under a decompressed state suitable for a target growing speed, and the epitaxial growth is carried out for time required for obtaining a target film thickness.

The silicon carbide single crystal wafer is produced in the manner described above.

In the epitaxial growth of the silicon carbide single crystal using a substrate which is perpendicular to the (0001) c axis, it is easy to control an amount of impurities in the epitaxial growth using a silicon surface as compared with epitaxial growth on a carbon surface. Hence, it is possible to control electric characteristics in a wider range in the epitaxial growth film on the silicon surface as compared with the carbon surface. In the silicon surface, bunching on a surface step is prone to be generated as compared with the carbon surface. That is, it is generally regarded as being difficult to obtain a flat epitaxial growth surface than the carbon surface. However, according to the producing method of the embodiment of the invention, it is possible to obtain an extremely flat epitaxial growth surface either on a silicon surface or a carbon surface.

According to the producing method of the silicon carbide single crystal wafer of the embodiment, when producing a silicon carbide single crystal wafer having a large opening diameter, e.g., having a diameter of 50 μm or more, it is possible to carry out the epitaxial growth having no substantially triangular lamination defect. That is, a silicon carbide single crystal wafer having a diameter of 50 mm or more is provided. Further, the silicon carbide single crystal wafer can be produced irrespective of whether the α type silicon carbide single crystal is 4H or 6H.

Modification of Embodiment

To enhance the utility ratio of the bulk crystal and to reduce propagation of a substrate defect, it is preferable that a wafer having an OFF angle as small as possible within a range of 0.1 to 10 is cut out from a silicon carbide single crystal. When the OFF angle has a distribution in a wafer plane, it is preferable that a wafer is cut out from a silicon carbide single crystal such that the distribution of the OFF angle is 80% or more of the entire area of the wafer cut out from the silicon carbide single crystal and the OFF angle is 0.1° or more. More concretely, when it is difficult to obtain a constant OFF angle over the entire surface of the wafer, it is convenient to increase the OFF angle substantially concentrically from 0° from the center toward the end of the wafer and limit an area where the OFF angle is less than 0.1° to a small region near a center of the wafer (20% or less of the entire area), or to increase the OFF angle substantially concentrically from 0° toward the center from the end of the wafer and limit the area where the OFF angle is less than 0.1° to a small region near one end (20% or less of the entire area).

(Silicon Carbide Single Crystal Wafer)

As an embodiment of the silicon carbide single crystal wafer, there is provided

A silicon carbide single crystal wafer wherein a substrate is cut out at an OFF angle from a (0001) c plane of an α-type silicon carbide single crystal of less than 2° and in an OFF direction in which a deviation from a (11-20) direction is less than 10°, the number of substantially triangular lamination defects exposed from a surface of a wafer which is epitaxial grown on the substrate is less than $4/cm^2$ over the entire surface of the wafer. In such a silicon carbide single crystal wafer, the number of substantially triangular lamination defects exposed on the wafer surface is less than $1/cm^2$ and more preferably, the number of substantially triangular lamination defects exposed on the wafer surface is 0. The number of lamination defects found after the molten alkali etching processing is less than $4/cm^2$ on the entire surface of the wafer, more preferably, the number is less than $1/cm^2$, and more preferably, the lamination defect is not found even after the etching.

If a surface of the silicon carbide single crystal wafer is observed using a differential interference (Nomarski) optical microscope, surface defects such as macro triangular pit and polytypic pit mix are not found unlike the conventional technique. In the silicon carbide single crystal wafer, in a region where an OFF direction is (11-20) direction, a deviation from the (11-20) direction is less than 10° and the OFF angle is less than 2° from the (0001) c plane, bumps and dips (surface roughness) on the surface by an atomic force microscope (AFM) does not exceed 2 nm and extremely flat. The number of substantially triangular lamination defects which may be generated when an OFF direction is (11-20) direction and a deviation from the (11-20) direction exceeds 10° is as extremely small as less than $4/cm^2$ even though the epitaxially grown crystal is checked by the molten alkali etching. The number of base bottom surface dislocations which is taken over from a substrate to epitaxially grown crystal is as extremely small as less than $10/cm^2$. Hence, it is possible to produce a high quality element. Concerning the surface roughness, if a detection region or a measurement spot diameter is large as in the optical measurement, the roughness is averaged and regarded as small. As the measurement region is narrower, the maximum value (maximum height: Ry) of roughness becomes smaller. In this specification, the "surface roughness" is defined as Ry which is obtained in a measurement region of 1 μm or more by the AFM, and a surface where Ry is sufficiently small and the macro bumps and dips can not be found is defined as a flat surface.

As a device expected in an electron device using the silicon carbide single crystal wafer, there is an MOS (Metal Oxide Semiconductor) field-effect transistor. A gate oxide film (insulation film) of the MOS structure is usually formed on a surface of an epitaxially grown film by thermally oxidizing an epitaxially grown film. Therefore, to produce an oxide film having constant film thickness and resistance to pressure, it is preferable that the surface of the epitaxially grown film before oxidization is sufficiently flat as compared with order of the oxide film thickness. The thickness of the gate oxide film is generally in a range of 20 to 60 nm. Thus, if a variation width permissible for the oxide film thickness is defined as 10%, it is necessary that the surface roughness of the epitaxially grown film is in a range of 2 to 6 nm or less. In this case, the surface roughness of silicon carbide single crystal according to the invention does not exceed 2 nm as described above. Thus, the silicon carbide single crystal of the invention is suitably used for producing an electron device especially MOS field-effect transistor.

(Use)

According to the silicon carbide single crystal wafer of the invention, macro triangular pit or polytypic are not incorporated, its surface is flat, base bottom surface dislocation is small, and the number of lamination defects is small and its quality is extremely high. Thus, the silicon carbide single crystal wafer of the invention is suitably be used for an electron device having excellent withstand voltage, breakdown strength, heat resistance, radiation resistance and the like, especially for a power device or a light-emitting diode.

EXAMPLES

The present invention will be explained concretely based on Examples and Comparative Examples, but the invention is not limited to the Examples of course.

Example 1

Wafer: as a wafer, a 6H wafer (50.8 mm diameter) was prepared. In the wafer, an OFF angle with respect to the c plane was 0.5° on the entire substrate and a deviation from the (11-20) direction of the OFF direction was 8°. A surface of a carbon surface of the prepared wafer was mirror polished and then, chemically and mechanically polished (CMP) by silica colloid for 8 hours, and the wafer thus obtained was used.

Growth conditions: the wafer was disposed in a hot wall CVD device. The wafer was rotated and in this state, 70 slm of hydrogen flowed and the temperature was increased while keeping the pressure at 120 mbar. When the temperature exceeded 1400° C., 8 sccm of propane gas was introduced. The temperature was further increased to 1650° C., this temperature was maintained, 20 sccm of monosilane gas was introduced and epitaxial growth was carried out for 1.5 hours. A supply ratio (C/Si) of raw gas was 1.2.

Figure 1:
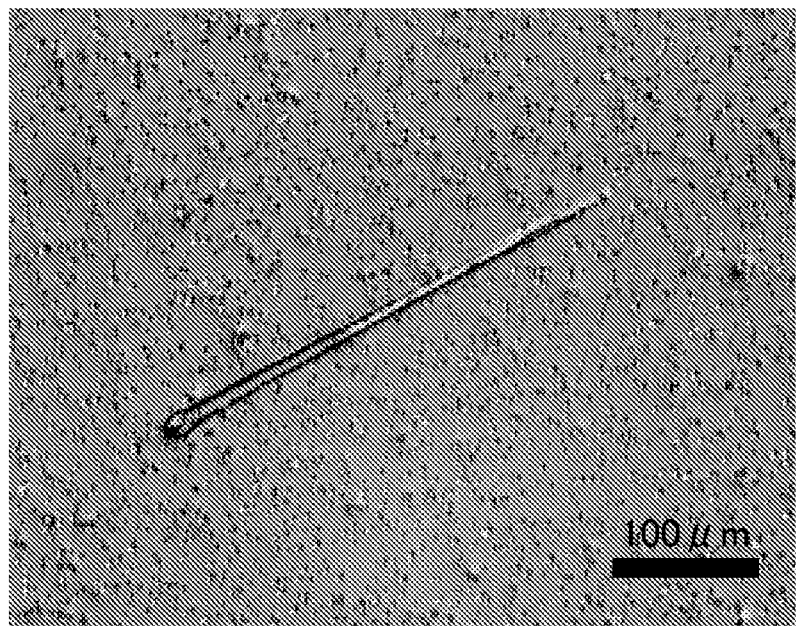
FIG. 1 is a diagram showing a differential interference optical microscope image of a surface of a silicon carbide single crystal wafer according to an Example 1.
Figure 7:
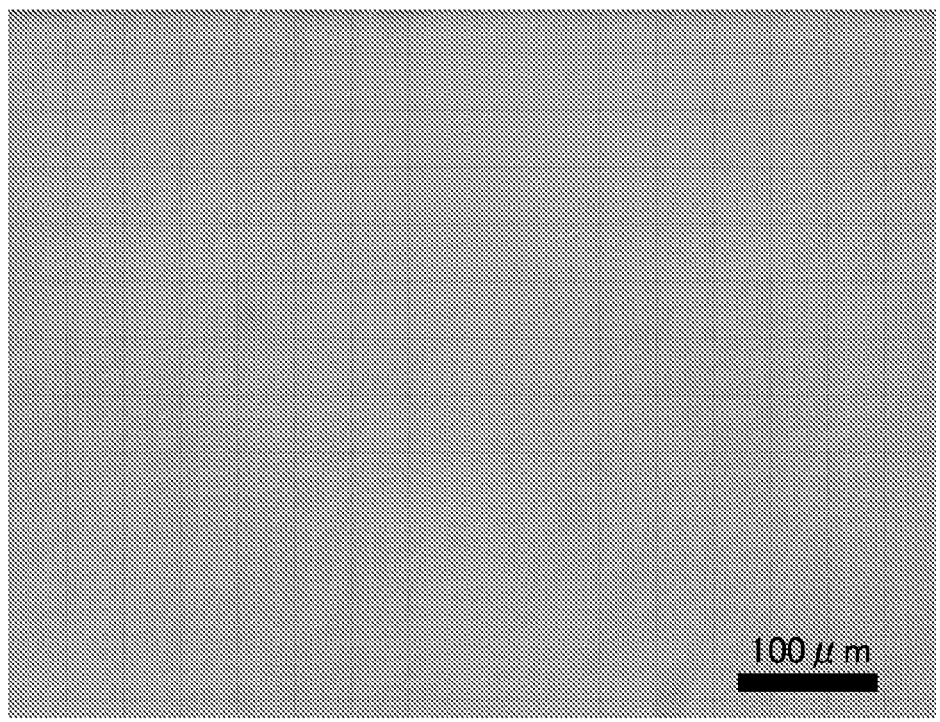
FIG. 7 is a diagram showing a differential interference optical microscope image on a surface of a silicon carbide single crystal wafer according to the Example 1.

Result: the obtained epitaxial film surface was observed by the differential interference (Nomarski) optical microscope, and there was no substantially triangular lamination defect although the entire wafer was observed. To check a lamination defect in the epitaxial film, the entire wafer was soaked in potassium hydroxide molted at 525° C. for five minutes so that it was etched. After the etching, the entire surface of the wafer was again observed using the differential interference optical microscope, a straight defect was partially found but no substantially triangular lamination defect was generated as shown in FIG. 1. Further, as shown in FIG. 7, an epitaxial film having an extremely flat surface with no line bump on the entire surface of the wafer was obtained. The film thickness of the epitaxial layer was 3.6 µm. The surface roughness was measured using an atomic force microscope. As a result, the maximum height (Ry) was 1.40 nm in a 2 µm angle range.

Example 2

Wafer: as a wafer, a 6H wafer (50.8 mm diameter) was prepared. In the wafer, an OFF angle with respect to the c plane was 0.6 to 1.0° on the entire substrate and a deviation from the (11-20) direction of the OFF direction had a distribution of 0 to 3°. A surface of a carbon surface of the prepared wafer was mirror polished and then, chemically and mechanically polished (CMP) by silica colloid for 8 hours, and the wafer thus obtained was used.

Growth conditions: the epitaxial growth was carried out for three hours under the same conditions as those of the Example 1.

Figure 8:
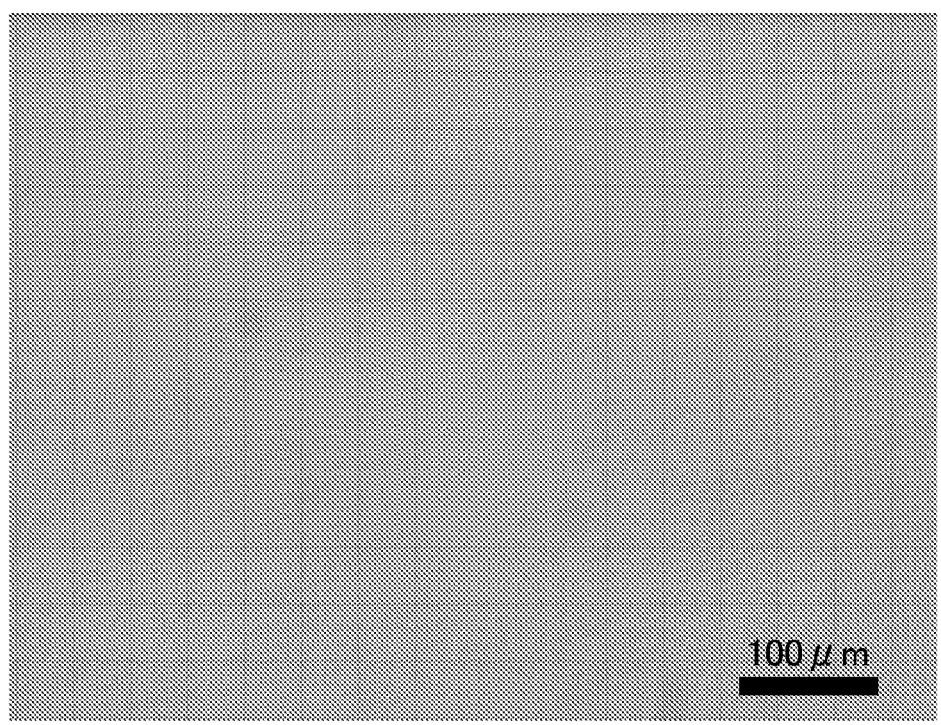
FIG. 8 is a diagram showing a differential interference optical microscope image on a surface of a silicon carbide single crystal wafer according to the Example 2.

Result: Substantially triangular lamination defects were not found before and after the etching like the Example 1. As shown in FIG. 8, an epitaxial film having extremely flat surface without line bump on the entire surface was obtained. The film thickness of the epitaxial layer was 7.1 µm. The surface roughness was measured using the atomic force microscope and as a result, the maximum height (Ry) was 1.71 nm in a 2 µm angle range.

Comparative Example 1

Wafer: as a wafer, a 6H wafer (50.8 mm diameter) was prepared. In the wafer, an OFF angle with respect to the c plane was 0.60 on the entire substrate and a deviation from the (11-20) direction of the OFF direction was 23°. A surface of a carbon surface of the prepared wafer was mirror polished and then, chemically and mechanically polished (CMP) by silica colloid for 8 hours, and the wafer thus obtained was used.

Growth conditions: the epitaxial growth was carried out for 1.5 hours under the same conditions as those of the Example 1.

Figure 2:
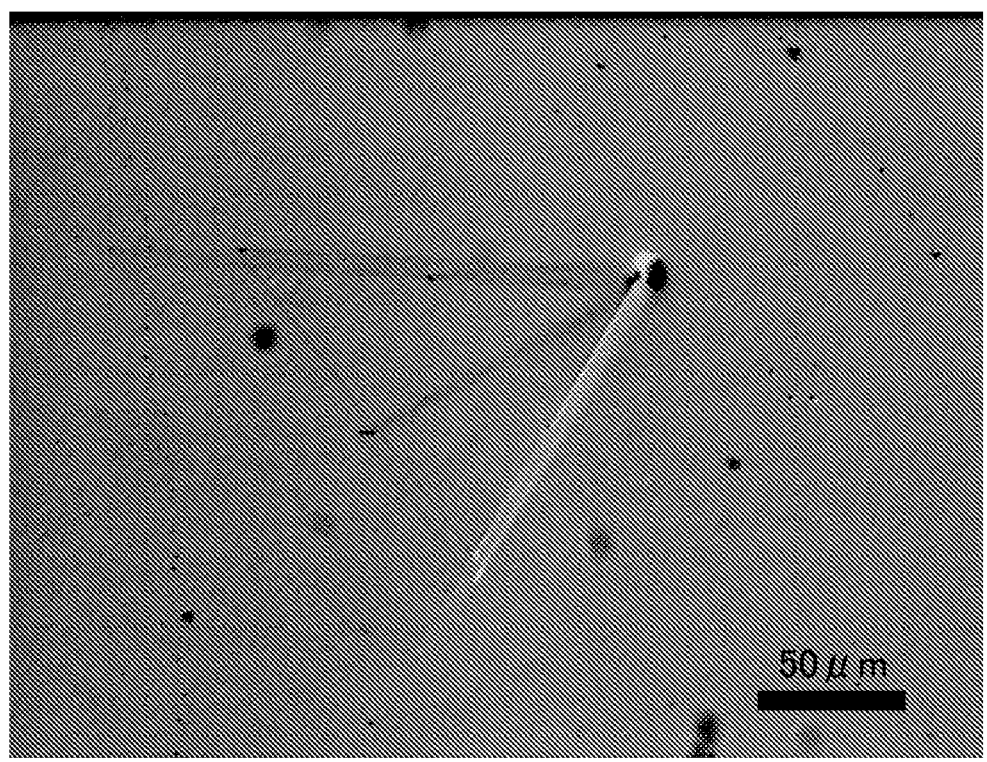
FIG. 2 is a diagram showing a differential interference optical microscope image of a surface of a silicon carbide single crystal wafer according to a Comparative Example 1.

Result: the obtained epitaxial film surface was observed by the differential interference (Nomarski) optical microscope, and substantially triangular lamination defect was slightly found as unclear image as shown in FIG. 2. In addition to this, a defect which could be regarded as a portion of a side of a substantially triangular shape was found, but since the defect portion was flat in almost the same level as a portion having no defect as a whole except the side portion and image contrast was weak and it was difficult to detect the defect. Hence, the entire wafer was soaked in potassium hydroxide molted at 525° C. for five minutes so that it was etched. After the etching, the entire surface of the wafer was again observed using the differential interference optical microscope, only a substantially triangular lamination defect remained as a portion which was difficult to be etched as shown in FIG. 3, and all defects including a defect which could not found before etching could be discriminated clearly. The average density of the number of defects generated on the entire surface of the wafer was 5/cm².

Comparative Example 2

Wafer: as a wafer, a 6H wafer (50.8 mm diameter) was prepared. In the wafer, an OFF angle with respect to the c plane was 0.40 on the entire substrate and a deviation from the (11-20) direction of the OFF direction was 14°. A surface of a carbon surface of the prepared wafer was mirror polished and then, chemically and mechanically polished (CMP) by silica colloid for 8 hours, and the wafer thus obtained was used.

Growth conditions: the epitaxial growth was carried out for 1.5 hours under the same conditions as those of the Example 1.

Figure 4:
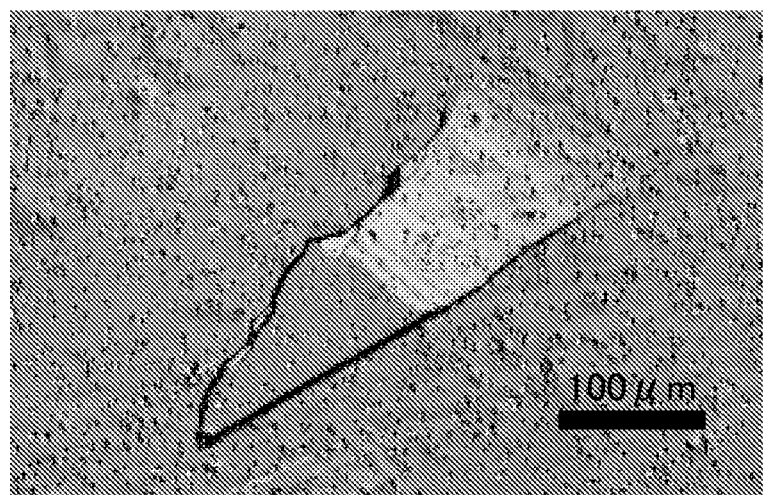
FIG. 4 is a diagram showing a differential interference optical microscope image on a surface of a silicon carbide single crystal wafer after etching processing according to a Comparative Example 2 (part 1)
Figure 5:
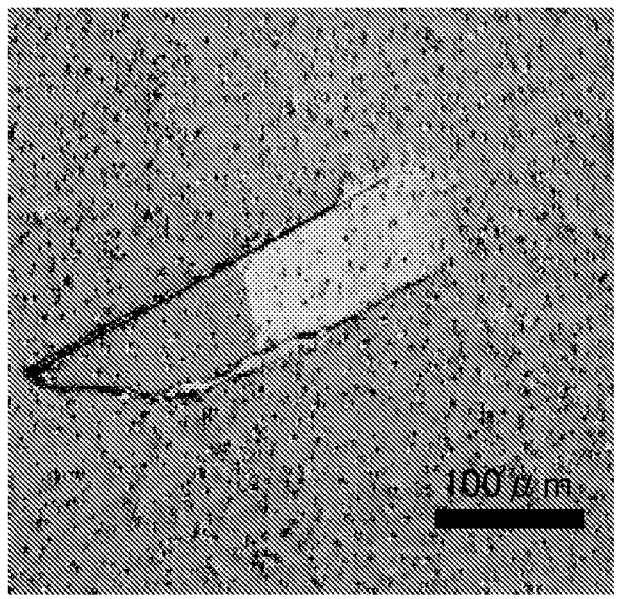
FIG. 5 is a diagram showing a differential interference optical microscope image on the surface of the silicon carbide single crystal wafer after etching processing according to the Comparative Example 2 (part 2)

Result: the obtained epitaxial film surface was observed by the differential interference (Nomarski) optical microscope, and substantially triangular lamination defect was slightly found as unclear image. The entire wafer was soaked in potassium hydroxide molted at 525° C. for five minutes so that it was etched. After the etching, the entire surface of the wafer was again observed using the differential interference optical microscope. As a result, as shown in FIG. 4, the defect could be confirmed on the entire surface of the wafer. The average density of the defect was 4/cm². As shown in FIG. 4, the number of complete triangular defects is smaller and a side of the triangular was arc or corrugated as compared with the Comparative Example 1. As shown in FIG. 5, there was a characteristic that there were many defects having unstable shapes such as polygonal shapes including a triangular portion as shown in FIG. 5.

Examples 3 and 4

Experiments were carried out under the same conditions as those of the Example 1 except that the supply ratio (C/Si) of raw gas was set to 0.8 (Example 3) and 1.4 (Example 4).

As a result, the same result as that of the Example 1 was obtained, a substantially triangular lamination defect was not found before and after the molten alkali etching, the surface roughness by the atomic force microscope did not exceed 2 nm and the surface was flat.

Example 5

Wafer: as a wafer, a 4H wafer (50.8 mm diameter) was prepared. In the wafer, an OFF angle with respect to the c plane was 0.6 to 1.0° on the entire substrate and a deviation from the (11-20) direction of the OFF direction had a distribution of 0 to 30. A surface of a carbon surface of the prepared wafer was mirror polished and then, chemically and mechanically polished (CMP) by silica colloid for 8 hours, and the wafer thus obtained was used.

Growth conditions: the epitaxial growth was carried out for three hours under the same conditions as those of the Example 1.

Figure 9:
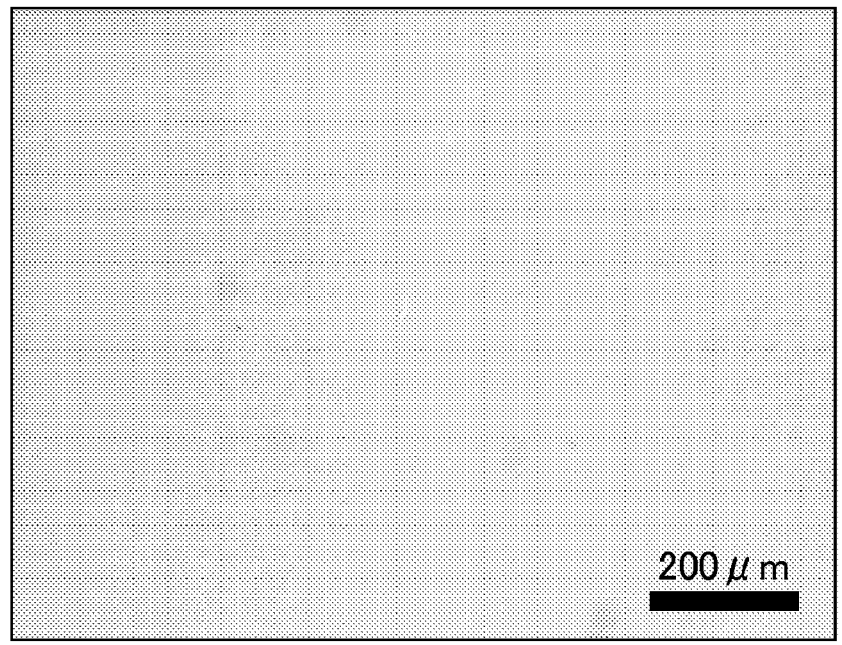
FIG. 9 is a diagram showing a differential interference optical microscope image on a surface of a silicon carbide single crystal wafer according to an Example 5.

Result: Substantially triangular lamination defects were not found before and after the etching like the Example 1. As shown in FIG. 9, an epitaxial film having extremely flat surface without line bump on the entire surface was obtained. The film thickness of the epitaxial layer was 5.6 μm. The surface roughness was measured using the atomic force microscope and as a result, the maximum height (Ry) was 1.80 nm in a 2 μm angle range.

Comparative Example 3

Wafer: as a wafer, a 4H wafer (50.8 mm diameter) was prepared. In the wafer, an OFF angle with respect to the c plane was 0.6° on the entire substrate and a deviation from the (11-20) direction of the OFF direction was 25°. A surface of a carbon surface of the prepared wafer was mirror polished and then, chemically and mechanically polished (CMP) by silica colloid for 8 hours, and the wafer thus obtained was used.

Growth conditions: the epitaxial growth was carried out for 1.5 hours under the same conditions as those of the Example 1.

Figure 10:
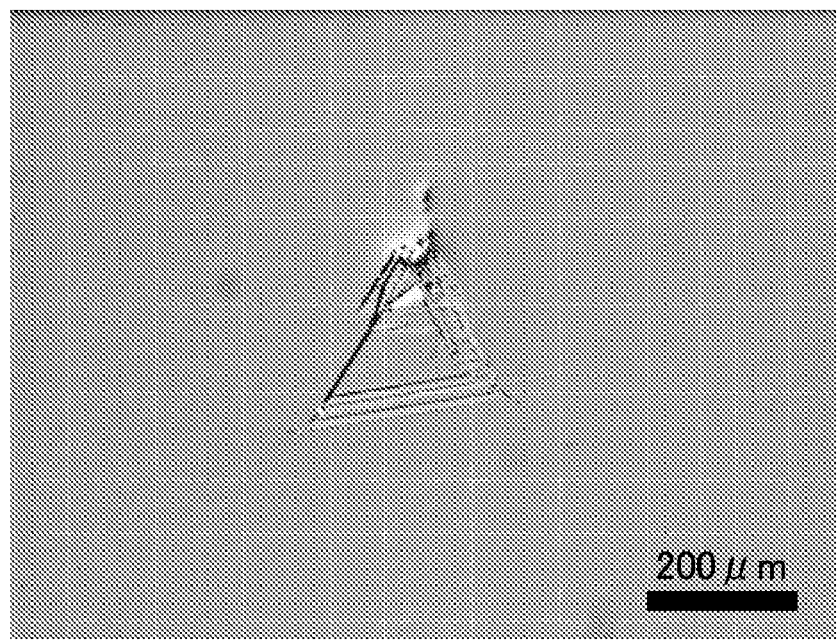
FIG. 10 is a diagram showing a differential interference optical microscope image on a surface of a silicon carbide single crystal wafer according to a Comparative Example 3.
Figure 11:
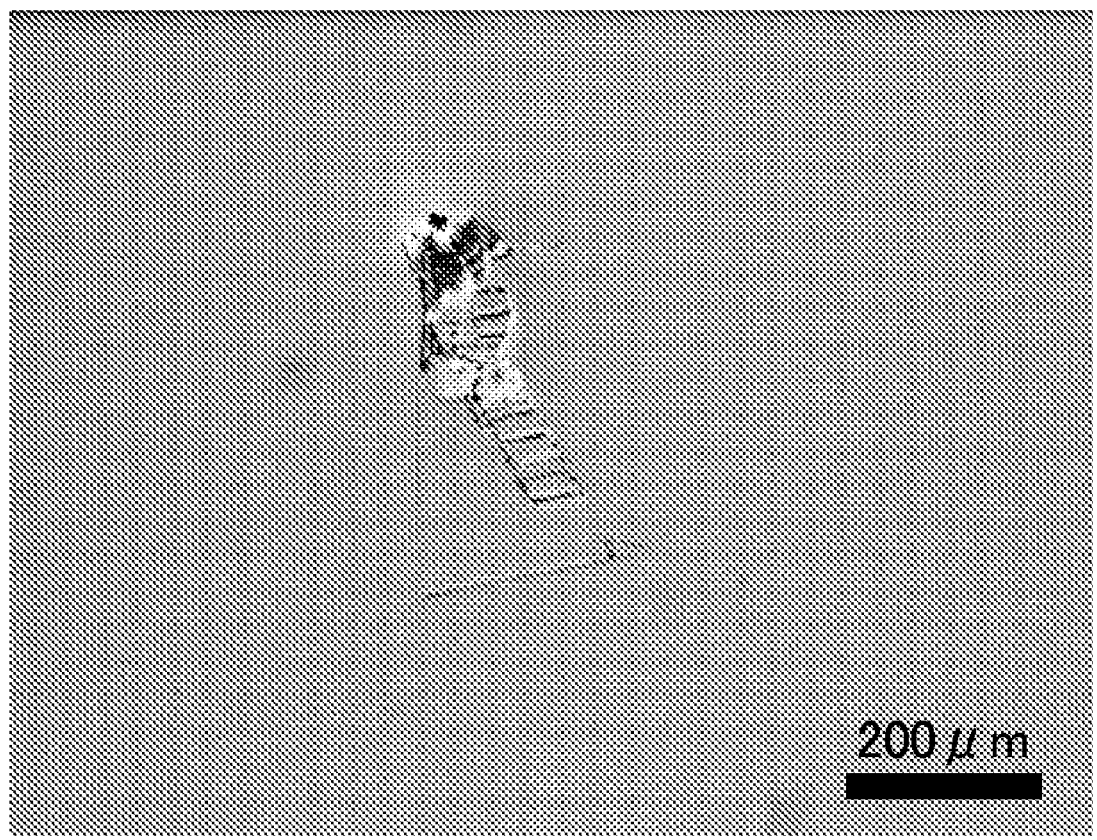
FIG. 11 is a diagram showing a differential interference optical microscope image on the surface of the silicon carbide single crystal wafer according to the Comparative Example 3.

Result: the obtained epitaxial film surface was observed by the differential interference (Nomarski) optical microscope, and substantially triangular lamination defects were relatively easily found as shown in FIG. 10. As shown in FIG. 11, a defect in which a portion of a side of a substantially triangular shape is especially clear was also found. Further, the entire wafer was soaked in potassium hydroxide molted at 525° C. for five minutes so that it was etched. After the etching, the entire surface of the wafer was again observed using the differential interference optical microscope. All of substantially triangular lamination defects including defects which could not found before etching could be clearly found. The average density of the number of defects generated on the entire surface of the wafer was 6/cm².

The present applicant claims a priority right based on prior Japanese patent application, i.e., Japanese patent application No. 2005-125548 (filed on Apr. 22, 2005) and Japanese patent application No. 2006-71468 (filed on Mar. 15, 2006). These specifications are incorporated in this specification by reference.

INDUSTRIAL APPLICABILITY

According to the present invention, it is possible to obtain a producing method of a silicon carbide single crystal wafer capable of enhancing the utility ratio of the bulk silicon carbide single crystal, the element characteristics and the cleavage, as well as a silicon carbide single crystal wafer obtained by such a producing method.

What is claimed is:

1. A silicon carbide single crystal wafer wherein a substrate is cut out at an OFF angle from a (0001) c plane of an α-type silicon carbide single crystal of less than 2° and in an OFF direction in which a deviation from a (11-20) direction is less than 10°, the number of substantially triangular lamination defects exposed from a surface of a wafer which is epitaxial grown on the substrate is less than 4/cm² over the entire surface of the wafer.

2. The silicon carbide single crystal wafer according to claim 1, wherein the number of substantially triangular lamination defects which are found after molten alkali etching processing is less than 4/cm² over the entire surface of the wafer.

3. The silicon carbide single crystal wafer according to claim 1, wherein surface roughness of the entire surface of the wafer is 2 nm or less and the surface is flat.

4. The silicon carbide single crystal wafer according to claim 1, wherein the OFF angle is in a range of 0.1 to 1°.

5. The silicon carbide single crystal wafer according to claim 1, wherein the OFF direction has a deviation from a (11-20) direction in a range of 0 to 5°.

6. A producing method of a silicon carbide single crystal wafer comprising: cutting out a wafer in an OFF direction in which at an OFF angle from a (0001) c plane of an α-type silicon carbide single crystal is less than 2° and a deviation from a (11-20) direction is less than 10°,
 disposing the wafer in a reaction container,
 supplying silicon source gas and carbon source gas into the reaction container, and
 reacting the silicon source gas and the carbon source gas with each other and for epitaxially growing an α-type (hexagonal) silicon carbide single crystal on the wafer.

7. The producing method of the silicon carbide single crystal wafer according to claim 6, wherein the OFF angle is in a range of 0.1 to 1°.

8. The producing method of the silicon carbide single crystal wafer according to claim 6, wherein the OFF direction has a deviation from a (11-20) direction in a range of 0 to 5°.

9. The producing method of the silicon carbide single crystal wafer according to claim 6, wherein a surface processing is carried out before the epitaxial growth so that the surface of the wafer cut out from the silicon carbide single crystal does not include working damage.

10. The producing method of the silicon carbide single crystal wafer according to claim 6, wherein a supply ratio (C/Si) of the carbon source gas (C) and the silicon source gas (Si) is 1.5 or less.

11. The producing method of the silicon carbide single crystal wafer according to claim 6, wherein the carbon source gas and the silicon source gas react with each other at 1550 to 1700° C.

* * * * *